United States Patent [19]

Temple

[11] 4,352,118
[45] Sep. 28, 1982

[54] THYRISTOR WITH SEGMENTED TURN-ON LINE FOR DIRECTING TURN-ON CURRENT

[75] Inventor: Victor A. K. Temple, Clifton Park, N.Y.

[73] Assignee: Electric Power Research Institute, Inc., Palo Alto, Calif.

[21] Appl. No.: 240,855

[22] Filed: Mar. 5, 1981

Related U.S. Application Data

[63] Continuation of Ser. No. 16,899, Mar. 2, 1979, abandoned.

[51] Int. Cl.$^3$ ............................................. H01L 29/74
[52] U.S. Cl. ........................................ 357/38; 357/20; 357/86
[58] Field of Search ............................ 357/20, 38, 86

[56] References Cited

U.S. PATENT DOCUMENTS

| | | | |
|---|---|---|---|
| 3,573,572 | 4/1971 | Cooper et al. | 357/38 |
| 3,586,927 | 6/1971 | Roach et al. | 357/86 |
| 4,012,761 | 3/1977 | Ferro et al. | 357/38 |
| 4,298,882 | 11/1981 | Homola et al. | 357/38 |

FOREIGN PATENT DOCUMENTS 2316354 10/1973 Fed. Rep. of Germany ........ 357/38

OTHER PUBLICATIONS

A. Blicher, "Thyristor Physics," ©1976 Springer-Verlag, New York, pp. 126, 127.

*Primary Examiner*—Joseph E. Clawson, Jr.
*Attorney, Agent, or Firm*—Flehr, Hohbach, Test, Albritton & Herbert

[57] ABSTRACT

A thyristor with a segmented turn-on line is provided in which portions of the turn-on line are covered by boundary shorts formed by the emitter electrode extending over the emitter-base junction into contact with the thyristor base zone. The portions of the emitter-base junction between the boundary shorts constitute turn-on segments along which gated thyristor turn-on can occur. A gate current source is provided for supplying carriers to the base zone. The thyristor includes means for directing carriers supplied by the gate current source to the turn-on segments. In operation, initial thyristor turn-on occurs only along the turn-on segments, thereby shortening the length of the thyristor turn-on line and increasing gate sensitivity. Preferably, the turn-on segments are spaced regularly along the emitter-base junction to permit adjacent "on" areas to rapidly merge. In the preferred embodiment, the means for directing carriers to the turn-on segments includes a gate barrier region adjacent the base zone and of opposite conductivity type. The gate barrier region establishes isolated areas of contact between a gate electrode and the base, the areas of contact being generally aligned with the turn-on segments.

8 Claims, 9 Drawing Figures

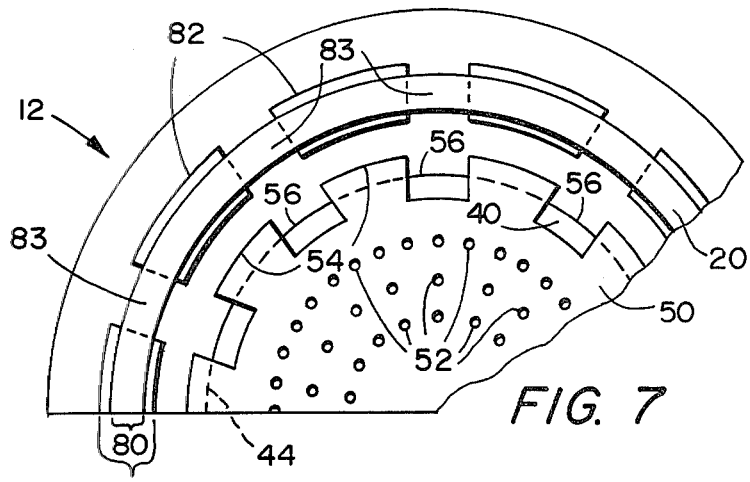
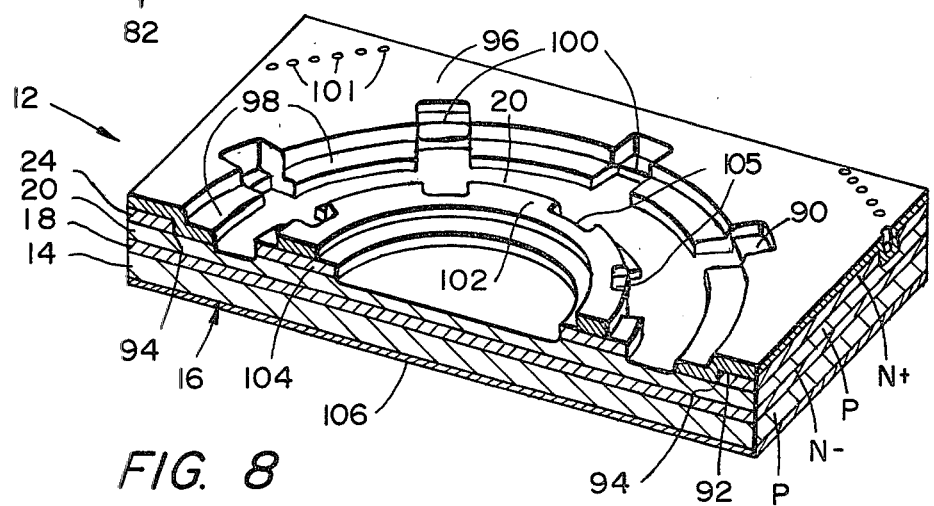
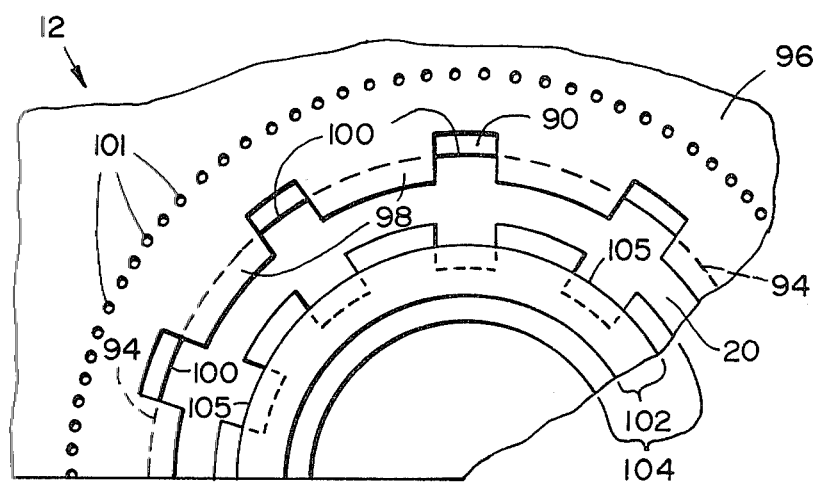

THYRISTOR WITH SEGMENTED TURN-ON LINE FOR DIRECTING TURN-ON CURRENT

This is a continuation of application Ser. No. 16,899 filed Mar. 2, 1979, abandoned.

The invention relates generally to semiconductor switching devices known as thyristors.

In constructing thyristors for use in circuit environments having large voltage gradients (high dV/dts) it is desirable to employ a heavily shorted emitter. Where the thyristor must also have a high di/dt rating, prior art thyristor geometries will generally provide for a long turn-on line. The combination of a heavily shorted emitter and a long turn-on line means that thyristor gate sensitivity will be low. An example of this problem is found in thyristors employing edge gating. An edge gated thyristor has a gate electrode which encircles the emitter zone. Such a geometry provides for a long turn-on line which means good di/dt performance. However, an edge gated geometry has the problem of a large dV/dt current which generally concentrates in the edge regions of the device. Unless the emitter is heavily shorted, the dV/dt rating will be quite low. As a result, prior edge gated thyristors generally combine a heavily shorted emitter with the characteristically long turn-on line of such devices, and gate sensitivity is sacrificed.

It is the general object of the present invention to provide a thyristor having relatively high gate sensitivity without appreciable sacrifice in device di/dt or dV/dt performance.

Another object of the present invention is to provide a thyristor having an improved electrode configuration which can be formed without additional fabrication steps.

Another object of the present invention is to provide a thyristor employing edge gating which has high gate sensitivity.

Accordingly, a thyristor is provided comprising a semiconductor body having at least four zones of alternate conductivity type. The zones include an emitter zone of a first conductivity type, and a base zone of a second conductivity type which forms a junction with the emitter zone. The emitter-base junction intersects the surface of the body to define an emitter boundary. An emitter electrode is provided in contact with the emitter zone. The emitter electrode extends over the emitter boundary into contact with the base zone at a plurality of locations spaced along said emitter boundary to form a plurality of boundary shorts. The portions of the emitter boundary between the boundary shorts form turn-on segments. A gate current source supplies carriers to the base zone. Means are provided for directing carriers supplied by the gate current source to the turn-on segments.

A preferred embodiment of the invention is described in detail below whith reference being made to the accompanying drawings, in which:

FIG. 7 is a partial top view as in FIG. 6 of an alternative embodiment of a thyristor according to the present invention.

FIG. 8 is a perspective view in partial cross-section of another alternative embodiment of a thyristor according to the present invention.

FIG. 9 is a partial top view of the thyristor of FIG. 8.

Figure 1:
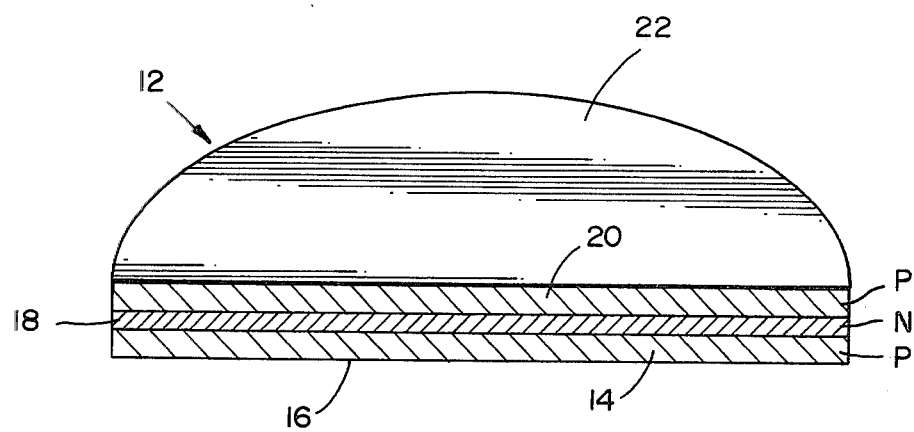
FIGS. 1-5 are perspective views in partial cross-section showing the method of forming a thyristor according to the present invention.

Referring to FIG. 1, a thyristor according to the present invention is formed beginning with a wafer 12 formed of a suitable semiconductor material such as monocrystalline silicon. Wafer 12 is processed by conventional techniques to produce layers of alternate conductivity type, yielding a PNP structure. A suitable method of forming wafer 12 begins with an N-type silicon chip into which impurities are introduced through the top and bottom surfaces. One or more of the conductivity zones may also be formed by alternate techniques such as epitaxial growth or ion implantation. The resultant semiconductor wafer includes a first P-type zone 14 extending along lower surface 16, an intermediate zone 18 of N conductivity type, and an upper P-type zone 20 along upper surface 22.

Figure 2:
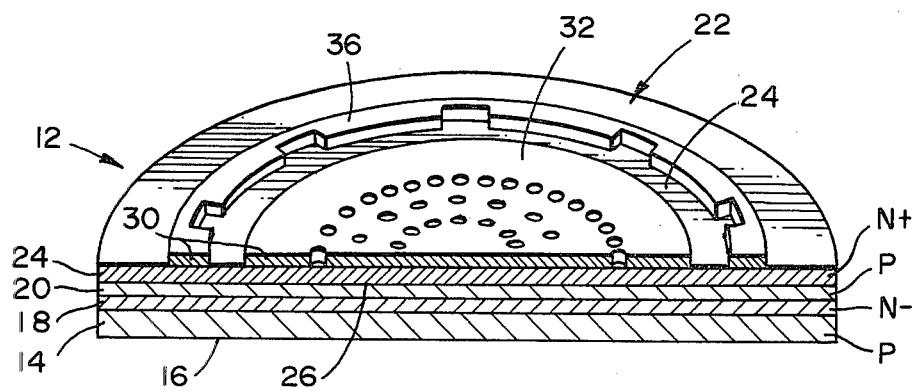

To provide a typical thyristor structure having at least four zones of alternate conductivity type, an additional zone is added to the wafer of FIG. 1. In the preferred embodiment, a fourth zone 24 of N conductivity type is added to wafer 12 along top surface 22 by any suitable method, such as diffusion, epitaxial growth, or ion implantation. After the above processing, wafer 12 constitutes a semiconductor body having four zones of alternate conductivity type, as shown in FIG. 2. Zone 24, which will become the thyristor emitter zone, is of a first conductivity type, and adjacent zone 20, which is the thyristor base zone, is of a second conductivity type and forms a junction 26 with the emitter zone. As illustrated in FIG. 2, the two N conductivity zones, 18 and 24, are designated N+ and N− to indicate the relatively higher level of N-type impurity doping in zone 24.

The subsequent processing steps to form a first embodiment of the thyristor according to the invention are illustrated in FIGS. 2-5. Referring to FIG. 2, top surface 22 of wafer 12 is coated with a masking layer 30. A suitable photoresist can be used for mask 30. Initially, mask 30 covers the entire top surface 22 of wafer 12, and portions are then removed by conventional photolithographic techniques to produce a masking pattern as shown in FIG. 2. The pattern includes a central mask portion 32 which will define the thyristor emitter. Numerous small openings 34 in mask portion 32 locate internal emitter shorts. An additional ring-shaped mask portion 36 encircles central portion 32.

After mask 30 is laid down, conventional etching techniques are employed to etch into the upper surface 22 of wafer 12. An etching solution is used which attacks the silicon of the wafer but not mask 30. Etching is allowed to proceed to a depth sufficient to penetrate emitter zone 24, separating the zone into a plurality of N+ regions separated by exposed portions of base zone 20.

Figure 3:
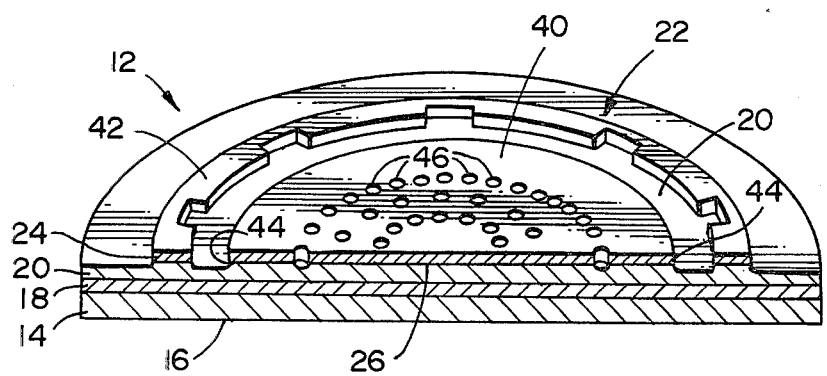

FIG. 3 shows the pattern of N+ regions on wafer 12 following removal of photoresist mask 30. The central N+ region is the thyristor emitter 40. Encircling emitter 40 adjacent base 20 is a narrow gate barrier region 42 of the same conductivity type as the emitter, the purpose of which is described below. After etching, emitter-base junction 26 intersects top surface 22 of wafer 12 to become the surface emitter boundary 44. In the first embodiment, emitter boundary 44 extends along the outer perimeter of emitter 40. Openings 46 in emitter 40, created by openings 34 in mask 30, will provide a pattern of emitter shorts.

The pattern of N+ regions on top surface 22 of wafer 12 could be formed by other well known techniques, such as by masked diffusion. If masked diffusion is used, a mask layer of silicon dioxide or the like is initially grown or otherwise laid down on the top P-type zone of the three-layer wafer shown in FIG. 1. Portions of the mask are then removed by conventional photolithographic and etching techniques to expose those areas of the surface where N+ regions are to be formed. Impurities of N conductivity type are then diffused into the exposed areas, producing the desired pattern of N+ regions on top surface 22. If masked diffusion is employed, the geometries of the N+ regions formed are essentially the same as in FIG. 3, with a centrally disposed emitter zone and encircling gate barrier region of N conductivity type. The emitter-base junction will extend to the top surface of the wafer, defining the emitter boundary. The subsequent fabrication steps outlined below would be the same for a thyristor formed by means of masked diffusion.

Figure 4:
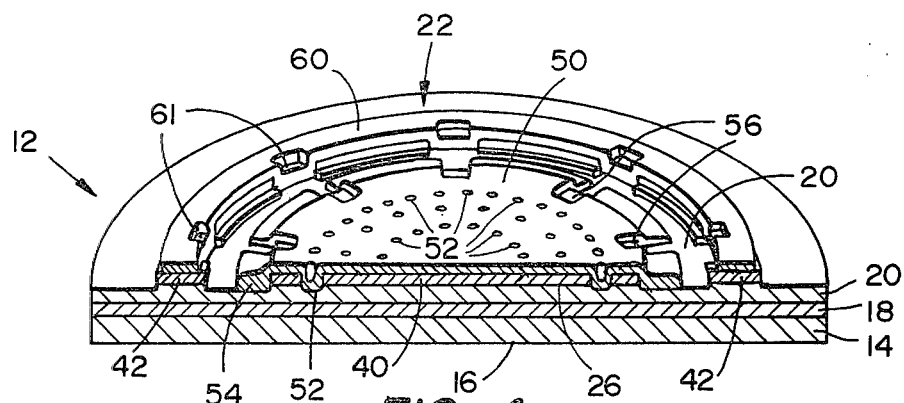

After the N+ regions have been defined and mask 30 is removed, top surface 22 of wafer 12 is coated by conventional means with a layer of a suitable conductive metal, for example, aluminum. Portions of the metal layer are then removed by conventional photolithographic and etching techniques to provide a metalization pattern as shown in FIG. 4. Metalization in contact with emitter 40 becomes emitter electrode 50. The emitter electrode extends into openings 46 to provide interior emitter shorts 52, which are spaced from emitter boundary 44. Electrode 50 also overlies emitter boundary 44 along a plurality of separate segments contacting base 20 to provide a plurality of boundary shorts 54. In the present invention, boundary shorts 54 are spaced at regular intervals along the length of emitter boundary 44. The shorts are separated by unshorted turn-on segments 56 along which gated thyristor turn-on can occur. As shown in FIG. 4, the boundary shorts 54 extend along a significant fraction of the total length of emitter boundary 44.

Generally encircling and spaced from emitter 40 is a relatively narrow band of metalization, forming the thyristor gate electrode 60. Portions of the gate electrode are in contact with gate barrier region 42. Other portions 61 constituting a significant fraction of the inner edge of the gate electrode, contact base zone 20 at a plurality of separate locations generally aligned with turn-on segments 56. The contour of the inner edge of gate barrier region 42 determines where gate electrode 60 contacts the base zone. The gate barrier region serves to substantially block gate current from passing between the gate electrode and the base zone. Gate current therefore enters the base zone only by way of gate portions 61. The fraction of the inner edge of gate electrode 60 which contacts the base zone (portions 61 taken together) is substantially equal to the fraction of the emitter boundary 44 constituting turn-on segments 56. The gate 60 serves as a gate current source and, together with gate barrier region 42, serves as means for directing carriers from gate electrode 60 to the turn-on segments 56 of the emitter zone.

Figure 5:
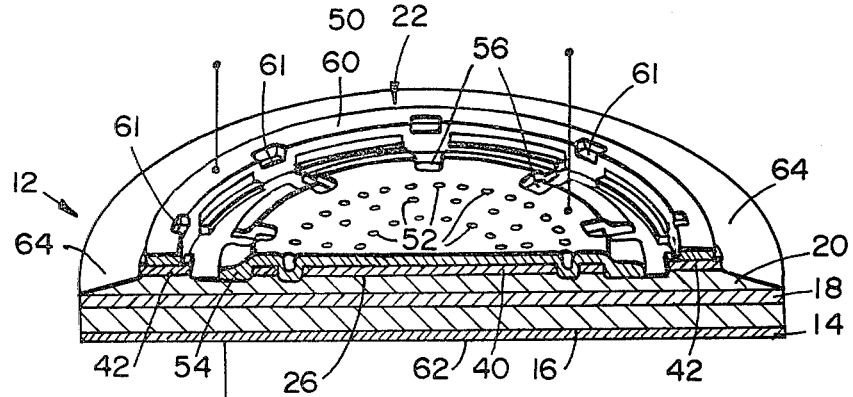

The completed thyristor, as shown in FIG. 5, will include anode contact 62 and beveled edge surfaces 64. Anode metalization 62 can be added to lower surface 16 either simultaneously with the top surface metalization, or at another time. Edge surfaces 64 are beveled to shape the electric fields in the device for high voltage blocking.

Figure 6:
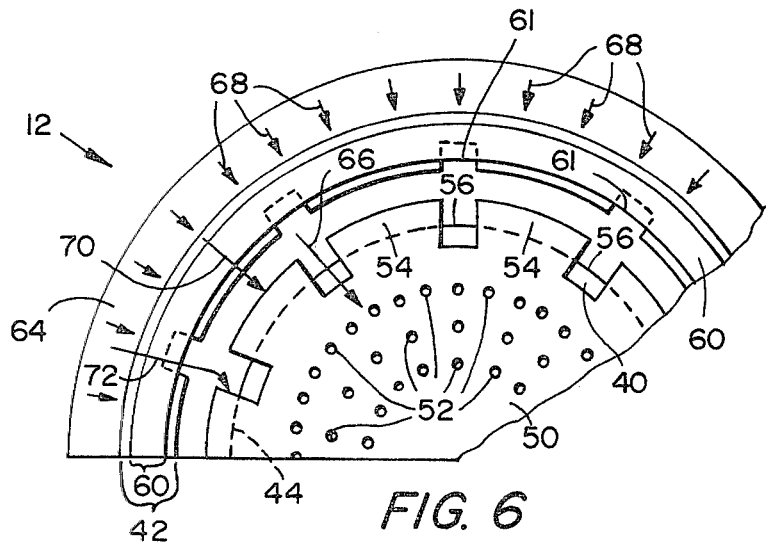
FIG. 6 is a partial top view of the thyristor of FIG. 5 illustrating gated turn-on of the thyristor.

Operation of the first embodiment of a thyristor according to the present invention is illustrated in FIG. 6. The thyristor is installed in a circuit with an external potential applied between anode 62 and emitter electrode 50. When anode 62 is forward biased relative to emitter electrode 50, only a small forward leakage current passes through the device prior to firing. To switch the thyristor into forward conduction, a positive voltage is applied to gate electrode 60. Gate current will enter base zone 20 at the separated portions 61 where gate electrode 60 contacts the base zone. As noted above, portions 61 are generally aligned with turn-on segments 56 of emitter boundary 44. The gate current passes through the base zone to the first line of emitter shorts 52 in the direction of arrows 66, forward biasing the emitter-base junction along turn-on segments 56. When sufficient forward bias is developed, carriers begin crossing the emitter-base junction in large numbers, switching on the thyristor in the usual manner.

Gated turn-on occurs substantially simultaneously at each of the turn-on segments 56. Gate current is conserved because the gate barrier region effectively channels the current to gate portions 61 which in turn direct carriers to turn-on segments 56. Relatively little gate current is lost to the adjacent emitter boundary shots 54. The total turn-on line length for the device is the combined length of turn-on segments 56, which is considerably shorter than the length of emitter boundary 44. The shortened turn-on line increases the gate sensitivity of the device.

One important function of boundary shorts is to increase the dV/dt rating of the thyristor. Arrows 68 illustrate the general flow pattern of dV/dt current around the edge of the device. A large portion of the dV/dt durrent will follow paths such as 70, and will pass directly into boundary shorts 54. Current following paths such as 72 will also tend to enter the nearest short, and will thus be diverted from biasing turn-on segments 56. Only a fraction of the dV/dt current will flow through the base zone to the interior emitter shorts 52, and thus potentially cause dV/dt turn-on.

The foregoing illustrates that, using the present invention, thyristor dV/dt current is effectively spread over both shorted and unshorted portions of emitter boundary 44. As such, the effect of the dV/dt current along each turn-on segment 56 is substantially dissipated. Gate current, on the other hand, is effectively channeled to the turn-on segments of emitter boundary 44, maximizing gate sensitivity.

Although total turn-on line length for the thyristor is reduced by the presence of boundary shorts 54, di/dt performance will not suffer appreciably. This is because of the turn-on segments 56 are spaced regularly along the emitter boundary and adjacent "on" areas will rapidly merge once turn-on has initiated. Only during initial thyristor turn-on will the area turned on be appreciably reduced by the presence of boundary shorts 54, and this presents no problem in most applications.

The following calculation illustrates how to determine the optimum total length of turn-on segments 56, relative to the length of emitter boundary 44. Assume, for example, that the thyristor will be edge gated, and will have a gate threshold of 50 milliamps (ma), and a dV/dt rating of 2000 volts per microsecond. A 2500 volt device with an N-base conductivity of 100 ohm-centimeters, an overall edge area outside the emitter boundary of 2-3 centimeters², and having a bevelled edge, will produce approximately 250 ma of dV/dt current at 2000 volts per microsecond. The amount of available gate current at the desired gate sensitivity is divided by the dV/dt current at the desired dV/dt rating to establish the approximate fraction of the emitter boundary constituting the turn-on segments. In this example, the fraction would be 50/250, or twenty percent. Thus, approximately 20% of emitter boundary 44 should constitute turn-on segments 56, and approximately 80% of the boundary should comprise boundary shorts 54. Optimum distribution of the boundary shorts may have to be experimentally verified since there are significant edge effects which are difficult to calculate. There is a significant loss of gate current if each individual turn-on segment becomes too narrow, for example. Narrow turn-on segments will provide a proportionate increase in the dV/dt rating, however. Optimum distribution of turn-on segments in a thyristor employing a two-inch diameter wafer having the above performance parameters might be 10 to 12 regularly spaced turn-on segments. Such a pattern of distribution should substantially eliminate significant edge effects.

A final design consideration for thyristors of the present invention is the location of the first line of the emitter shorts 52 relative to emitter boundary 44. As a first approximation, the emitter shorts should be placed to obtain the desired dV/dt current threshold, which is the above example is 250 ma. As is well known to those skilled in the art of thyristor fabrication, emitter short density should be tailored to prevent thyristor turn-on along the emitter-base junction until the dV/dt current threshold is exceeded. to a first order accuracy, the dV/dt current can be assumed constant as a function of angle around the thyristor periphery. It will be appreciated that the emitter short patterns illustrated in the Figures are suggestive only and that the actual pattern of emitter shorts employed will be based on the above criteria.

The invention is well suited to thyristors employing edge gating. Heretofore, edge gated thyristors have been particularly employed where safe voltage breakover firing is desired. Edge gating does present certain problems, however, such as low gate sensitivity due to the long turn-on line, and a relatively low dV/dt rating resulting from the large edge dV/dt current. The present invention provides significant improvement in gate sensitivity by shortening the initial turn-on line length, and does so without significantly impairing the di/dt rating. Moreover, the thyristor dV/dt rating is increased. These improvements are accomplished by changes in the N+ and metalization patterns of the thyristor which require no additional fabrication steps or other production costs.

FIG. 7 illustrates an alternative embodiment thyristor according to the present invention. The embodiment of FIG. 7 includes the same four layer thyristor construction as the first embodiment, and includes a central N+ emitter 40 with an overlying emitter metalization 50 forming an emitter electrode. Portions of emitter electrode 50 extend over emitter boundary 44 into contact with base zone 20 to form a plurality of boundary shorts 54. Portions of the emitter boundary between the boundary shorts constitute turn-on segments 56. As in the first embodiment, a pattern of emitter shorts 52 is provided within the emitter zone. Outside the emitter is gate electrode 80 and a plurality of N+ gate barrier region segments 82. As in the first embodiment, the gate barrier region serves to substantially block gate current from passing between the gate electrode and the base zone. In the embodiment of FIG. 7, the separate sections of gate barrier region 82 isolate the portions 83 of the gate electrode which contact the base zone, portions 83 being at a plurality of separate locations generally aligned with turn-on segments 56. Fabrication of the embodiment of FIG. 7 is substantially the same as for the first embodiment, except that a different pattern of masking and etching is used to produce separate N+ gate barrier region segments 82. Similarly, operation of the embodiment of FIG. 7 is the same as in the first embodiment.

The present invention can also be employed on center-gated thyristors. FIGS. 8 and 9 illustrate an alternative embodiment employing center gating. Fabrication of the embodiment of FIGS. 8 and 9 begins with a PNP semiconductor wafer 12 having similar layering to that shown in FIG. 1. Although a different shape in the drawings, wafer 12 of FIG. 8 is fabricated in the same way as wafer 12 in FIG. 1. An N+ zone is provided on top surface 22 to form a semiconductor body having at least four zones of alternate conductivity type. The four layers illustrated in FIG. 8 are referred to by the same identifying numbers as in FIGS. 1-5, with N+ zone 24 being etched to create the thyristor emitter and adjacent zone 20 being the base. As in the first embodiment, a photoresist mask is laid down on top surface 22 and portions of top zone 24 are removed by conventional photolithographic and etching techniques to produce the N+ pattern shown in FIGS. 8 and 9. A pattern of metalization is then laid down by conventional techniques to produce the pattern of thyristor electrodes shown.

The embodiment of FIGS. 8 and 9 includes an emitter zone 90 of N+ conductivity type. The emitter-base junction 92 intersects surface 22 of wafer 12 to define an emitter boundary 94. The emitter boundary encircles a central exposed portion of base 20. Emitter electrode 96 extends over emitter boundary 94 into contact with the base zone at a plurality of separate locations to form a plurality of boundary shorts 98. The portions of emitter boundary 94 between the boundary shorts form turn-on segments 100. A first line of emitter shorts 101 is illustrated, encircling emitter boundary 94. The gate current source for this embodiment includes gate electrode 102. An N+ gate barrier region 104 serves to substantially block gate current from passing between the base zone and portions of the gate electrode. Gate electrode 102 overlies gate barrier region 104, with portions of the gate electrode being in contact with the gate barrier region and other portions of the gate electrode contacting the base zone at a plurality of separate locations 105. Gate portions 105 constitute a significant fraction of the outer edge of gate 102 and are generally aligned with turn-on segments 100. As in the previous embodiments, a thyristor anode electrode 106 is provided on the lower surface 16 of wafer 12 in contact with zone 14.

In this embodiment, the emitter 90 encircles the gate and gate barrier region. The fraction of the outer edge of the gate electrode contacting the base zone (portions 105) is substantially equal to the fraction of emitter boundary 94 constituting turn-on segments 100.

Design considerations for center gated thyristors according to the present invention are essentially the same as for the edge gated first embodiment. The portion of emitter boundary 94 constituting unshorted turn-on segments 100 is determined by dividing the available gate current at the desired gate sensitivity for the thyristor by the dV/dt current at the desired dV/dt rating for the thyristor. Emitter shorts 101 are positioned to give the desired thyristor dV/dt rating. In most applications, additional emitter shorts will be required outside the first line of shorts 101 illustrated.

In operation, the embodiment of FIGS. 8 and 9 functions in the same manner as the first embodiment. With anode 106 forward biased relative to emitter electrode 96, the thyristor is switched into forward conduction by the application of a positive voltage to gate electrode 102. Gate current will enter the base zone along a plurality of locations 105 at which gate electrode 102 contacts base zone 20. Turn-on will occur along each turn-on segment 100 substantially simultaneously, and the "on" areas will rapidly merge to allow the thyristor to accommodate high di/dts. The presence of boundary shorts 98 along a significant fraction of the emitter boundary increases the thyristor dV/dt rating.

Center gated thyristors generally have less dV/dt problems than edge gated thyristors and also have shorter turn-on lines and generally higher gate sensitivity. It is therefore anticipated that the present invention will be more commonly applied to edge gated configurations although, as shown in FIGS. 8 and 9, it can be applied to center gated thyristors. In either configuration, the invention allows for tailoring of the length and distribution of the thyristor turn-on line to design requirements.

Additional alternative embodiments are possible within the scope of the invention. For example, the alternate form of segmented gate barrier region illustrated in FIG. 7 could be applied to the center gated thyristor of FIGS. 8 and 9. Both the center and edge gated thyristors could be provided with amplifying stages incorporating the present invention. Each stage could be provided with a segmented turn-on line as in the embodiments shown, or only the initial stage could be so formed.

Other means for directing carriers supplied by the gate current source to the thyristor turn-on segments will occur to those skilled in the art. Low impedance paths could be provided in the base zone, for example. A deeply contoured gate electrode could be used to direct a large percentage of the gate current to the turn-on segments. The gate could be segmented into isolated islands of metalization externally interconnected. The invention could incorporate a radiation responsive gate current source. Non-radial thyristor geometries employing straight turn-on lines could also be used.

The invention provides a thyristor having relatively high gate sensitivity without appreciable sacrifice in device di/dt or dV/dt performance. The invention further provides a thyristor having an improved electrode configuration which can be formed without additional fabrication steps. The invention additionally achieves an edge gated thyristor which has high gate sensitivity.

What is claimed is:

1. A thyristor comprising: a semiconductor body having at least four zones of alternate conductivity type, including an emitter zone of a first conductivity type, a base zone of a second conductivity type forming a junction with said emitter zone, said junction intersecting a surface of said body to define an emitter boundary, an emitter electrode in contact with said emitter zone and extending beyond said emitter boundary and into contact with said base zone at a plurality of locations spaced along said emitter boundary to form a plurality of boundary shorts, the portions of said emitter boundary between said boundary shorts forming turn-on segments, said boundary shorts being formed over a substantial majority portion of said emitter boundary relative to said turn-on segments to provide relatively high dV/dt capability, a gate current source including a gate electrode for supplying carriers to said base zone, and means for directing carriers supplied by said gate current source to said turn-on segments including a continuous gate barrier region of said first conductivity type adjacent said base zone and opposite and substantially coextensive with said emitter boundary and carrying said gate electrode, said gate barrier region serving to substantially block gate current from passing between said gate electrode and said base zone, portions of said gate electrode being in contact with said gate barrier region and other portions of said gate electrode contacting said base zone at a plurality of separate locations generally aligned with said turn-on segments for directing carriers supplied by said gate electrode substantially only to said turn-on segments to provide a shortened turn-on line for increased gate sensitivity.

2. A thyristor as in claim 1 in which said gate electrode is on said surface of said body generally encircling said emitter zone.

3. A thyristor as in claim 1 in which said boundary shorts are spaced at regular intervals along the length of said emitter boundary.

4. A thyristor as in claim 1 in which the available gate current at the desired gate sensitivity for the thyristor divided by the dV/dt current at the desired dV/dt rating for the thyristor establishes the approximate fraction of said emitter boundary constituting said turn-on segments.

5. A thyristor as in claim 1 including a plurality of emitter shorts within said emitter zone spaced from said emitter boundary.

6. A thyristor as in claim 1 in which said gate electrode is disposed outside said emitter boundary generally encircling said emitter zone.

7. A thyristor as in claim 1 in which said portions of the inner edge of said gate electrode contacting said base zone is substantially equal in number to the portions of said emitter boundary constituting said turn-on segments.

8. A thyristor as in claim 1 where the contour of the inner edge of said gate barrier region determines said contact of said gate electrode with said base zone.

* * * * *